United States Patent [19]
Grasset

[11] Patent Number: 5,786,712
[45] Date of Patent: Jul. 28, 1998

[54] FAST DIFFERENTIAL SAMPLE-AND-HOLD CIRCUIT

[75] Inventor: Jean-Charles Grasset, Fontaine, France

[73] Assignee: Thomson-CSF Semiconducteurs Specifiques, Paris, France

[21] Appl. No.: 704,606

[22] PCT Filed: Mar. 16, 1995

[86] PCT No.: PCT/FR95/00317

§ 371 Date: Sep. 16, 1996

§ 102(e) Date: Sep. 16, 1996

[87] PCT Pub. No.: WO95/25329

PCT Pub. Date: Sep. 21, 1995

[30] Foreign Application Priority Data

Mar. 16, 1994 [FR] France ................... 94 03086

[51] Int. Cl.[6] ................................ G11C 27/02
[52] U.S. Cl. ................................ 327/94
[58] Field of Search ................ 327/65, 66, 90, 327/91, 93, 94, 96, 560–553; 330/252, 253

[56] References Cited

U.S. PATENT DOCUMENTS

| | | | |
|---|---|---|---|
| 4,873,457 | 10/1989 | Sanielevici | 327/94 |
| 5,039,880 | 8/1991 | Astegher et al. | 327/96 |
| 5,047,666 | 9/1991 | Astegher et al. | 327/94 |
| 5,081,423 | 1/1992 | Koyama et al. | 327/94 |
| 5,298,801 | 3/1994 | Vorenkamp | 327/91 |

*Primary Examiner*—Timothy P. Callahan
*Assistant Examiner*—My-trang Nu Ton
*Attorney, Agent, or Firm*—Oblon, Spivak, McClelland, Maier & Neustadt, P.C.

[57] ABSTRACT

A fast differential sample-and-hold circuit includes two transistors controlled so as to be turned on or off. The output signal of the circuit is recovered at the terminals of an output capacitor connecting the emitters of the two transistors. The sample-and-hold circuit includes additional circuitry having two dynamic current generators and an additional capacitor which make the current flowing through the transistors constant when they are on. To this end, the two dynamic current generators are modulated by differential current which is output by the additional capacitor and the variations in which reproduce the current variations which appear in the output capacitor.

20 Claims, 7 Drawing Sheets

FAST DIFFERENTIAL SAMPLE-AND-HOLD CIRCUIT

BACKGROUND OF THE INVENTION

1. Field of the Invention

The invention relates to circuits for sampling and holding analog electrical signals, and more particularly fast sample-and-hold circuits.

Such sample-and-hold circuits are used, for example, in the processing of the signals output by CCD photosensitive detectors.

More generally, the invention also relates to the sample-and-hold circuits used in any other type of application.

2. Discussion of the Background

The production of fast sample-and-hold circuits essentially involves the use of open-look architectures, so as to best exploit the intrinsic characteristics of the technologies used. Such is the case, for example, with the fast NPN bipolar transistor technology.

According to the prior art, as described, for example, in patent EP-A-0,394,506, examples of known fast sample-and-hold circuits include architectures such as that represented in FIG. 1. This is a differential-type structure in which the NPN transistors T1 and T2 act as switches.

The input signals are applied to the bases B1 and B2 of the respective transistors T1 and T2, and the output signal is recovered between the emitters E1 and E2 of the transistors T1 and T2.

A capacitor C12 connects the emitters E1 and E2. The circuit represented in FIG. 1 operates in two regimes. One of the regimes is the follower regime. Each of the two transistors T1 and T2, biased using a current generator Io connecting its emitter to the earth of the circuit, is then on. The other regime is the off regime. The current sources Io are then coupled and the transistors T1 and T2 are off.

In follower regime, if the common-mode bias voltage present on each of the bases B1 and B2 is denoted Vm, the variable input signal applied to the base B1 is denoted $$+\frac{Ve}{2}$$

and the variable input signal applied to the base B2 denoted $$-\frac{Ve}{2},$$

the total voltage VB1 applied to the base B1 is written:

$$VB1 = Vm + \frac{Ve}{2}$$

and the total voltage of VB2 applied to the base B2:

$$VB2 = Vm - \frac{Ve}{2}$$

The memory capacitor C12 of the sample-and-hold circuit connects the emitters E1 and E2.

The voltage VC12 existing across the terminals of this capacitor is therefore written $$VC12 = VE1 - VE2$$

where VE1 and VE2 represent the voltages applied respectively to the emitters E1 and E2.

Now, it is known that:

$$VB1 = VBE1 + VE1$$

and $$VB2 = VBE2 + VE2,$$

where VBE1 and VBE2 represent respectively the base-emitter voltages of the transistors T1 and T2.

The voltage of VC12 can therefore be written:

$$VC12 = VB1 - VB2 + (VBE2 - VBE1)$$

i.e.:

$$VC12 = VE + (VBE2 - VBE1).$$

In the so-called "small signal" regime, that is to say when the amplitude of the variable input signal is very small compared to the amplitude of the DC bias voltages, it is known to the person skilled in the art that the term VBE2–VBE1 can be neglected. However, when the amplitude of the variable input signal can no longer be considered as small compared to the amplitude of the DC voltages, this term is no longer negligible.

The circuit is then termed nonlinear.

In practice, three causes give rise to this nonlinearity.

A first cause is the Early effect, which appears in the transistors T1 and T2. The voltage VBE of each transistor then varies under the effect of the modulation of the saturation current of the baseemitter junction of the transistor. This first cause of nonlinearity is solved by producing a connection layout known to the person skilled in the art by the name "cascode" connection. As represented in FIG. 1, transistors TC1 and TC2, suitably biased by the voltages Vo applied to their base, are then connected in series with the respective transistors T1 and T2.

A second cause resides in the fact that the transistors T1 and T2 do not operate with a constant current but with a dynamic current modulated by the current Ic flowing from the capacitor C12. As is known to the person skilled in the art, this gives:

$$VBE2 - VBE1 = Ut \times \ln[(Io+Ic)/(Io-Ic)]$$

with $Ic = C12 \frac{dVC12}{dt}$ where Ut is the thermodynamic potential (Ut=26 millivolts at a temperature of 300 degrees kelvin). In the above equation, ln[X] is the notation chosen to represent the natural logarithm of the quantity X.

A third cause is due to the combination of the first and second causes, which combine and make the base currents of T1 and T2 nonlinearly variable (modulation of the base current by modulation of Ic, modulation of the gain of the transistor by the Early effect).

According to the prior art, the second cause is attenuated by increasing the value of the current Io. The influence of the current Ic is therefore reduced.

This method has numerous drawbacks.

Increasing the current Io leads to an increase in the power consumed by the circuit. Furthermore, this increase in current necessarily leads to an increase in the geometry of the transistors T1 and T2, in order for the latter to operate with reasonable current densities. The base-emitter capacitance of each of the transistors T1 or T2 is increased. In off regime, a non-negligible fraction of the variable voltage applied to the base of the transistor T1 and T2 can then be found on the emitter of these transistors. A stray output voltage is then detected at the terminals of the capacitor C12.

SUMMARY OF THE INVENTION

The invention does not have these drawbacks.

The subject of the invention is a differential sample-and-hold circuit comprising a first and a second transistor (T1 and T2) controlled so as to be turned on or off, the output signal of the sample-and-hold circuit being recovered at the terminals of an output capacitor (C12) connecting the emitters (E1,E2) of the said transistors, characterized in that it comprises means for making the current Io flowing through the transistors constant when they are on, during the sampling phases, in spite of the current variations in the capacitor.

BRIEF DESCRIPTION OF THE DRAWINGS

Other characteristics and advantages of the invention will emerge on reading a preferred embodiment, given with reference to the figures appended hereto, in which.

DETAILED DESCRIPTION OF THE PREFERRED EMBODIMENTS

Throughout the figures, the same references denote the same elements.

Figure 1:
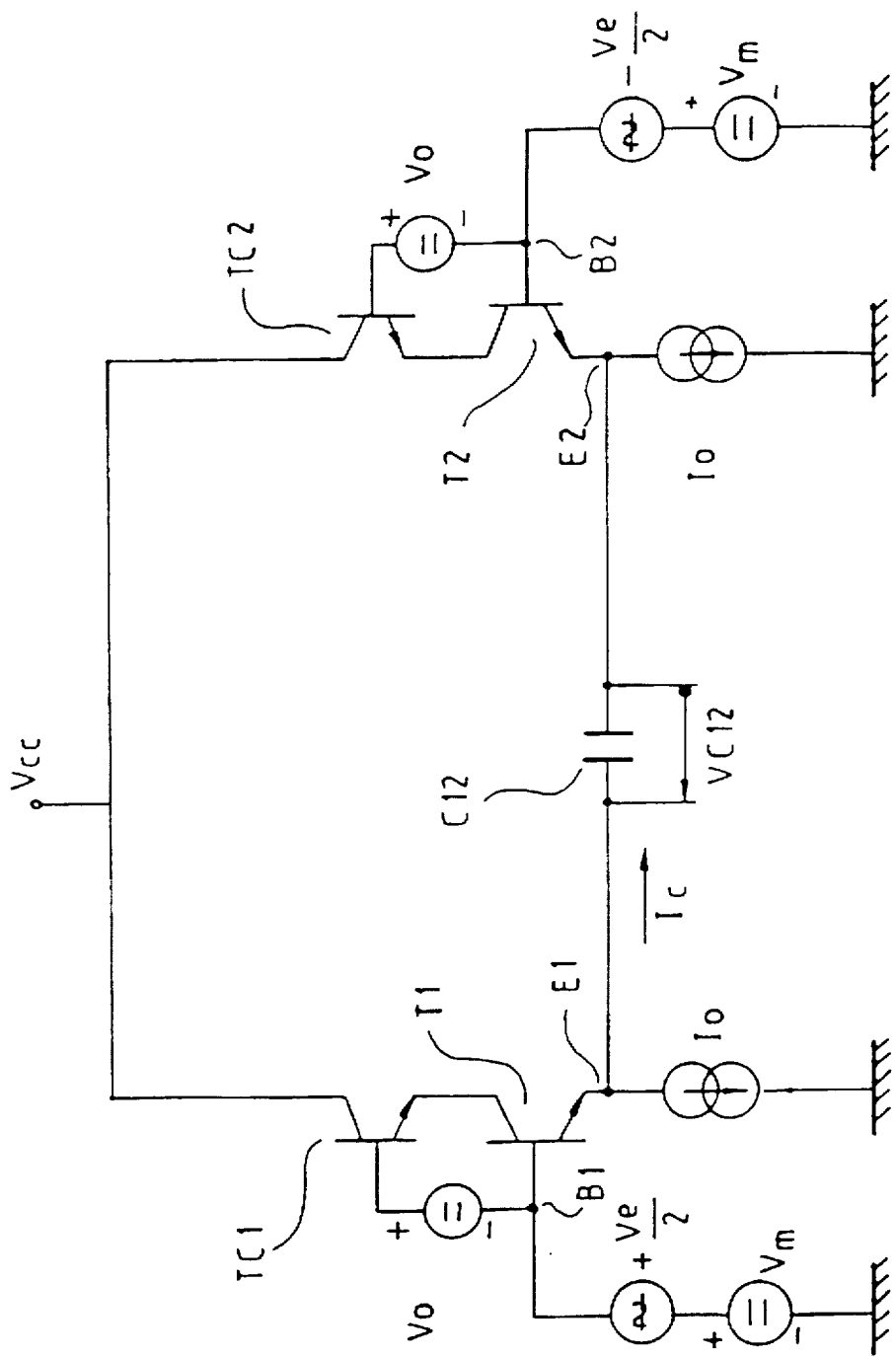
FIG. 1 represents a sample-and-hold circuit according to the prior art.

FIG. 1 has been described above and therefore need not be referred to again.

Figure 2:
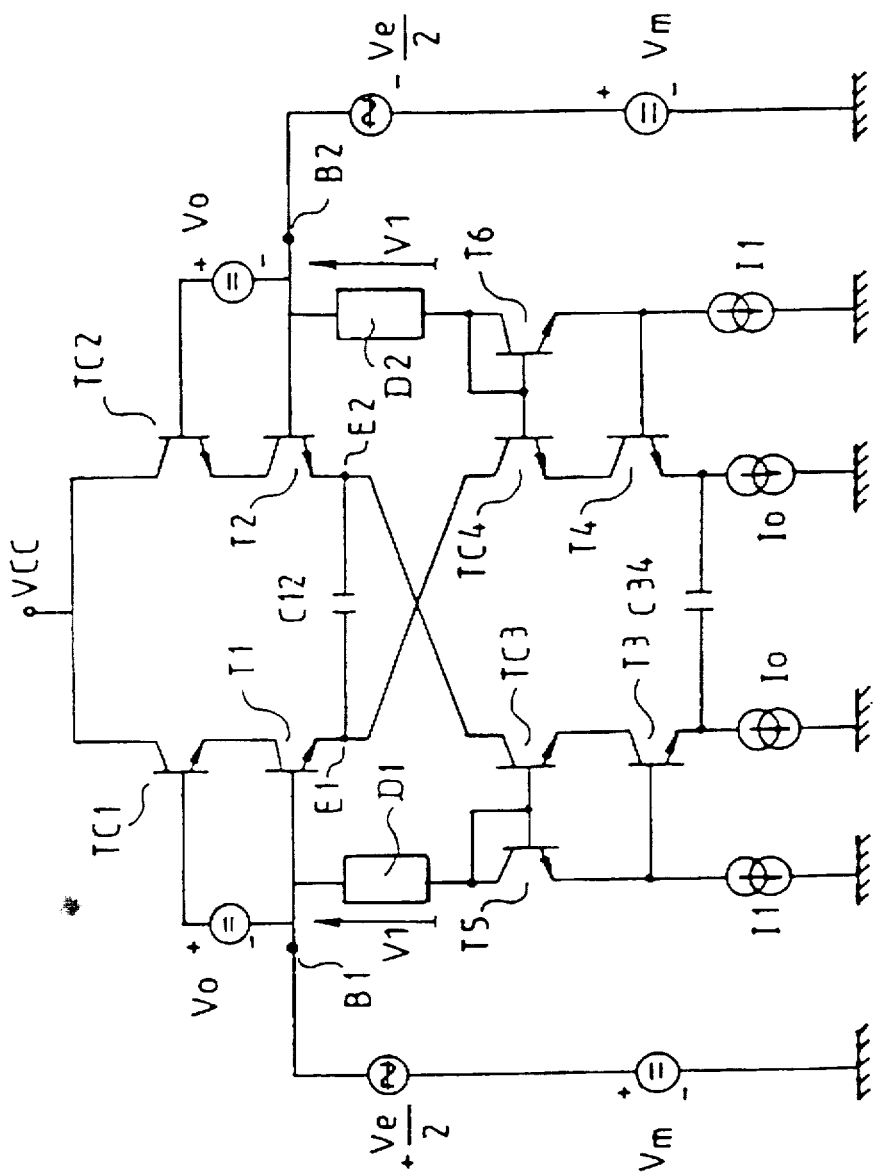
FIG. 2 represents the circuit diagram of a sample-and-hold circuit according to the invention.

FIG. 2 represents the circuit diagram of a sample-and-hold circuit according to the invention.

This sample-and-hold circuit is constructed using a differential structure. The input signals $$+\frac{Ve}{2}$$

and $$-\frac{Ve}{2}$$

are applied to the bases B1 and B2 of the respective transistors T1 and T2, and the output signal is recovered at the terminals of the capacitor C12 connecting the emitters E1 and E2 of T1 and T2.

As before, two suitably biased transistors TC1 and TC2 are connected in series with the respective transistors T1 and T2 so as to constitute a "cascode" connection.

A common-mode bias voltage Vm is applied to each of the two bases B1 and B2.

According to the invention, the two transistors T1 and T2 are supplied by two dynamic current generators. These dynamic current generators are integrated into the circuits so as to deliver currents whose variations make the current flowing through the transistors T1 and T2 constant. A first dynamic current generator is associated with the transistor T1. It consists of a transistor T4 whose base receives a signal varying at the frequency of the signal applied to the base of the transistor T2 and whose emitter is connected to a constant current generator Io. A second dynamic current generator is associated with the transistor T2. It consists of a transistor T3 whose base receives a signal varying at the frequency of the signal applied to the base of a transistor T1 and whose emitter is connected to a constant current generator of the same value Io.

Preferably, the transistors T3 and T4 are respectively connected to the transistor T2 and T1 via the transistors TC3 and TC4 which constitute "cascode" connections. The collector of the transistor T3 is therefore connected to the emitter of the transistor TC3 whose collector is connected to the emitter of the transistor T2. Similarly, the collector of the transistor T4 is connected to the emitter of the transistor TC4 whose collector is connected to the emitter of the transistor T1.

A capacitor C34, preferably of the same capacitance as the memory capacitor C12, connects the emitters of the transistors T3 and T4. The current variations appearing in the capacitor C34 are therefore equal in amplitude, but of opposite sign, to those appearing in the capacitor C12, and a constant current substantially equal to Io flows through them.

As indicated above, the current generators are modulated by the variable signals applied to the inputs B1 and B2 of the sample-and-hold circuit.

In order to prevent the transistors TC3 and TC4 from saturating, the common-mode voltage applied to these transistors is offset by a voltage V1.

A dipole D1 therefore connects the base B1 of the transistor T1 to the base of the transistor TC3, and a dipole D2, preferably identical to the dipole D1, connects the base B2 of the transistor T2 to the base of the transistor TC4. The dipoles D1 and D2 may be made using a resistor or a set of diodes connected in series, as will be specified hereafter.

In order to prevent the transistors T3 and T4 from saturating, the DC voltages applied to the bases of the transistors TC3 and T3 are offset, as are the DC voltages applied to the bases of the transistors TC4 and T4. To this end, a transistor T5 has both its collector and its base connected to the base of the transistor TC3 and its emitter connected to the base of the transistor T3.

Similarly, a transistor T6 has both its collector and its base connected to the base of the transistor TC4 and its emitter connected to the base of the transistor T4.

A current generator I1 connects the base of each of the transistors T3 and T4 to the earth of the device, thus fixing the value of the current flowing through each of the dipoles D1 and D2.

One advantage of the invention is that it resorts to no feedback (positive or negative). Thus, according to the invention, the circuits making it possible to cancel the modulation of the currents flowing through the transistor T1 and T2 place no limit on speed and stability.

Another advantage of the invention is the substantial increase in the dynamic input impedance of the sample-and-hold circuit due to the reduction in the variations of the base current of the circuit. The result of this is that there is then no need to feed the signal to the input of the sample-and-hold circuit at very low impedance.

Figure 3A:
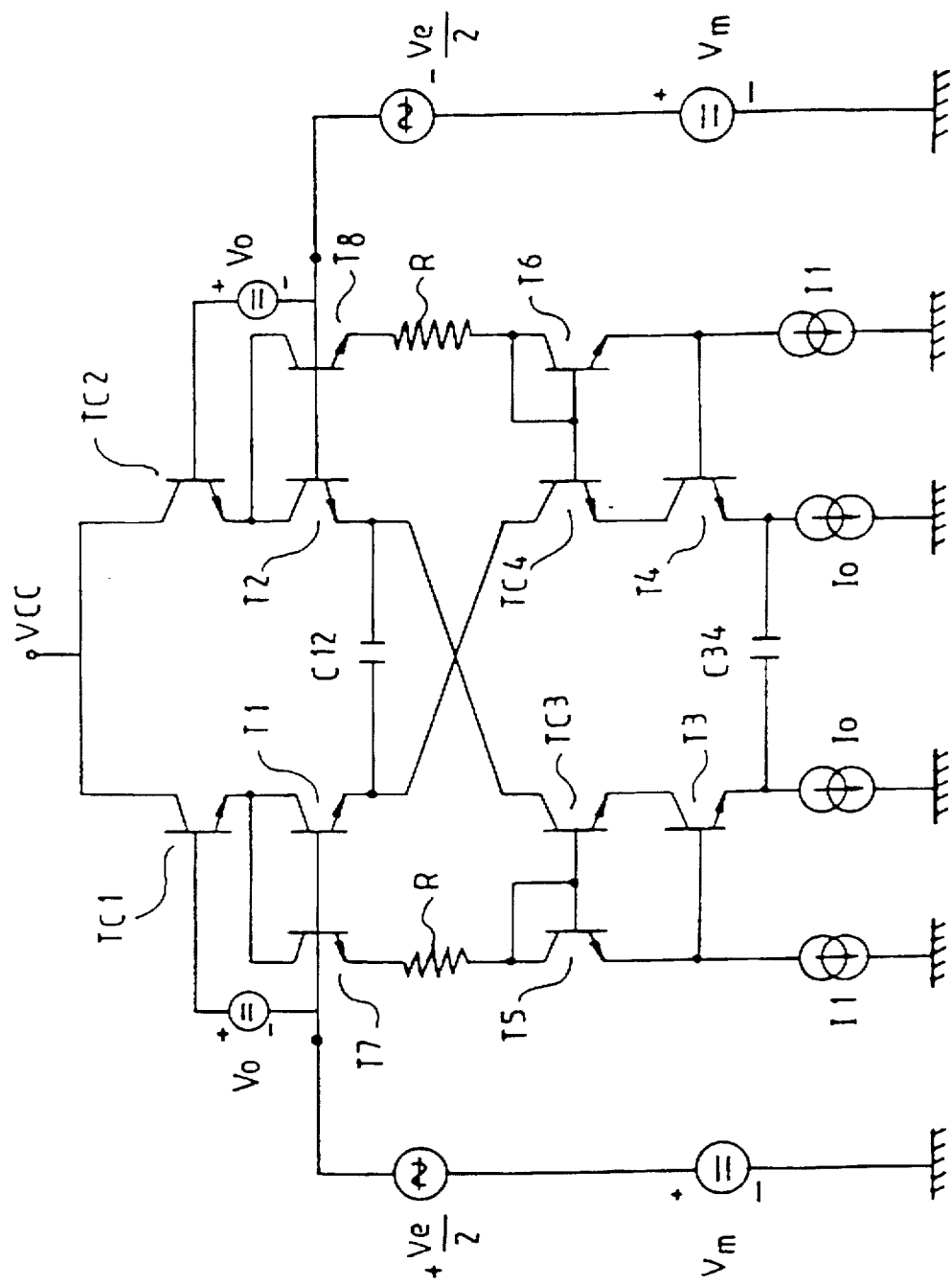
FIGS. 3a and 3b represent the diagram of a sample-and-hold circuit according to the preferred embodiment of the invention.

FIG. 3a represents the diagram of a sample-and-hold circuit according to the preferred embodiment of the invention.

All the constitute elements of the circuit represented in FIG. 2 are found again in FIG. 3a. According to the circuit in FIG. 3a, almost all of the current I1 of the current generator connecting the base of the transistor T3 to earth flows through the transistor T7 whose base is connected to the base of the transistor T1, whose collector is connected to the emitter of the transistor TC1 and whose emitter is connected to that terminal of the dipole D1 previously connected (cf. FIG. 2) to the base of the transistor T1.

Similarly, almost all of the current I1 of the current generator connecting the base of the transistor T4 to earth flows through the transistor T8 whose base is connected to the base of the transistor T2, whose collector is connected to the emitter of the transistor TC2 and whose emitter is connected to that terminal of the dipole D2 previously connected (cf. FIG. 2) to the base of the transistor T2.

Such a device has the advantage that it avoids the generators which deliver the voltages Vm and Ve having to draw almost all of the current I1.

Figure 3B:
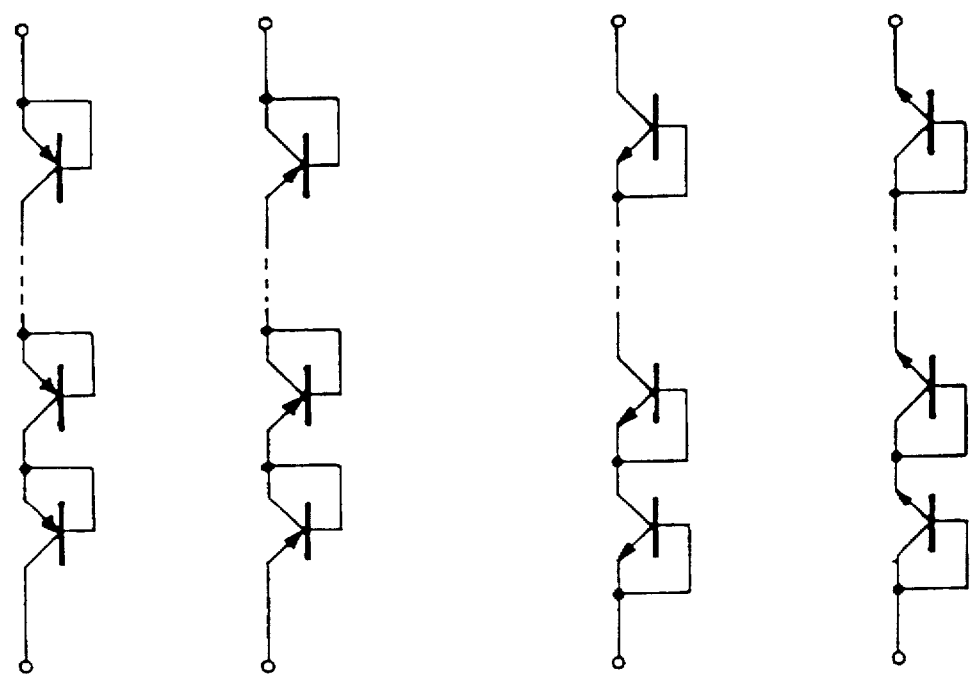

In FIG. 3a, the dipoles D1 and D2 are made using a resistor R. However, it is also possible to use chains of diode in series to form these dipoles. This may, for example, involve a chain of diodes consisting of forward-biased or reverse-biased NPN transistors or else a chain of diodes consisting of forward-biased or reverse-biased PNP transistors according to FIG. 3b. As is known to the person skilled in the art, a chain of n diodes connected in series and having a current I1 flowing through them has a dynamic impedance equal to nUt/I1, where Ut is the thermodynamic potential mentioned above. This dynamic impedance can then be relatively small, thereby increasing the speed of response of the circuit.

Figure 4:
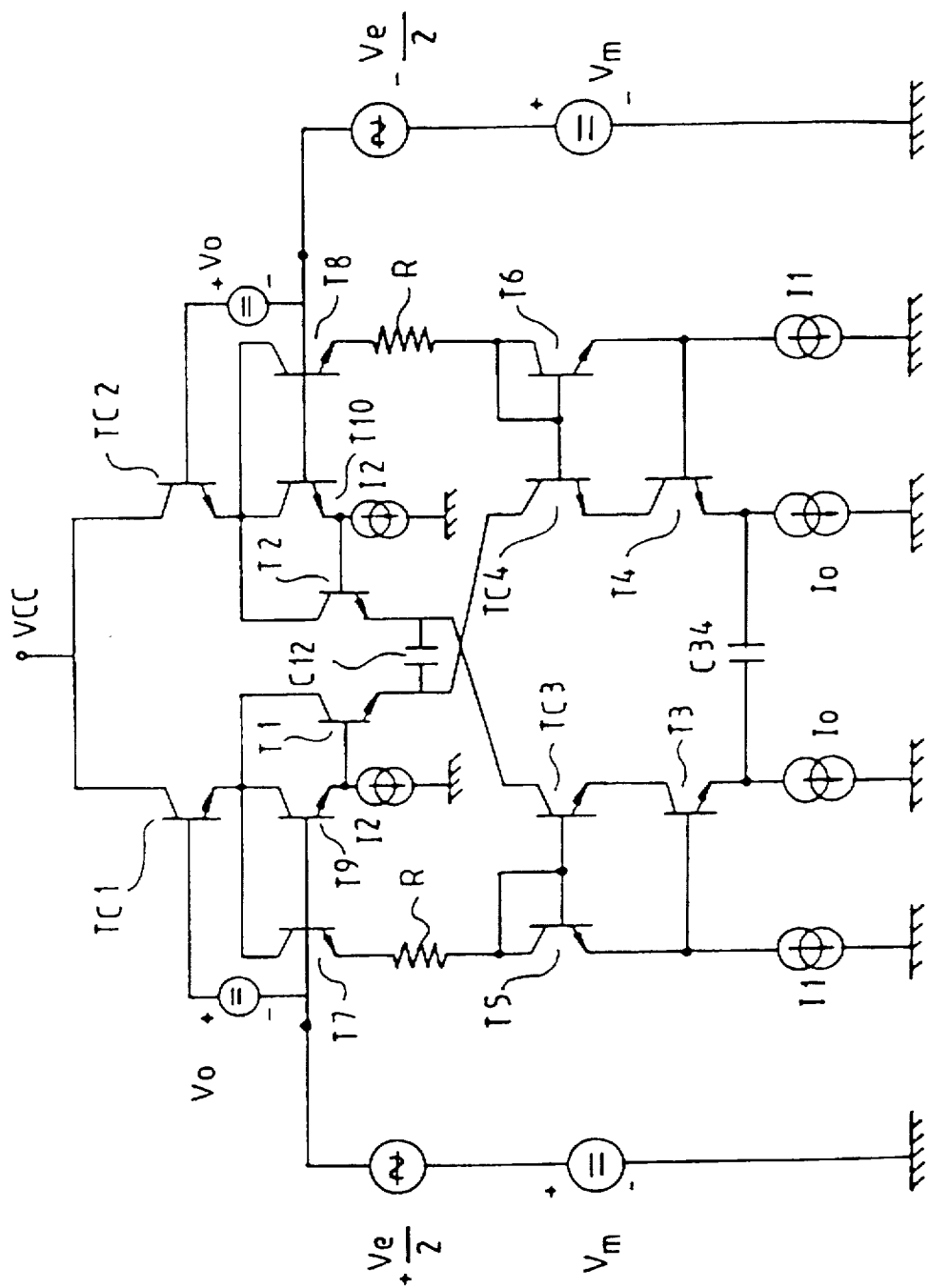
FIG. 4 represents the diagram of the sample-and-hold circuit in FIG. 3, in which a first improvement has been made.

FIG. 4 represents the diagram of the sample-and-hold circuit in FIG. 3a, in which a first improvement has been made.

The diagram in FIG. 4 reproduces the elements of the diagram in FIG. 3a. It comprises two additional transistors, T9 and T10, and two additional current generators I2. The base of the transistor T7 is then no longer connected to the base of the transistor T1 but to the base of a transistor T9 whose collector is connected to the emitter of the transistor TC1 and whose emitter is connected, on the one hand, to a current generator I2 and, on the other hand, to the base of the transistor T1.

Similarly, the base of the transistor T8 is no longer connected to the base of the transistor T2 but to the base of a transistor T10 whose collector is connected to the emitter of the transistor TC2 and whose emitter is connected, on the one hand, to a current generator I2 and, on the other hand, to the base of the transistor T2.

A time delay is then introduced between the signal applied to the sample-and-hold circuit input, now represented by the bases of the transistor T9 and T10, and the signal applied to the bases B1 and B2 of the transistor T1 and T2. According to the invention, this time delay tends to compensate for the time delay induced by the correction device. The efficiency of the correction is then improved because of the virtual simultaneity of the variations in the currents flowing through T1 and T2 and originating, on the one hand, from C12 and, on the other hand, from TC3 and TC4.

As has just been described, the invention makes it possible to improve the nonlinearity of the sample-and-hold circuits. First, by way of example, for a signal Ve of 4 volts peak-to-peak, the distortion level, in follower regime, of a sample-and-hold circuit of the type described in FIG. 7 may reach the value of −75 dB at the frequency of 50 MHz, whereas, all other things being equal, the distortion level of a sample-and-hold circuit according to the prior art is only −50 dB at the same frequency.

Figure 5:
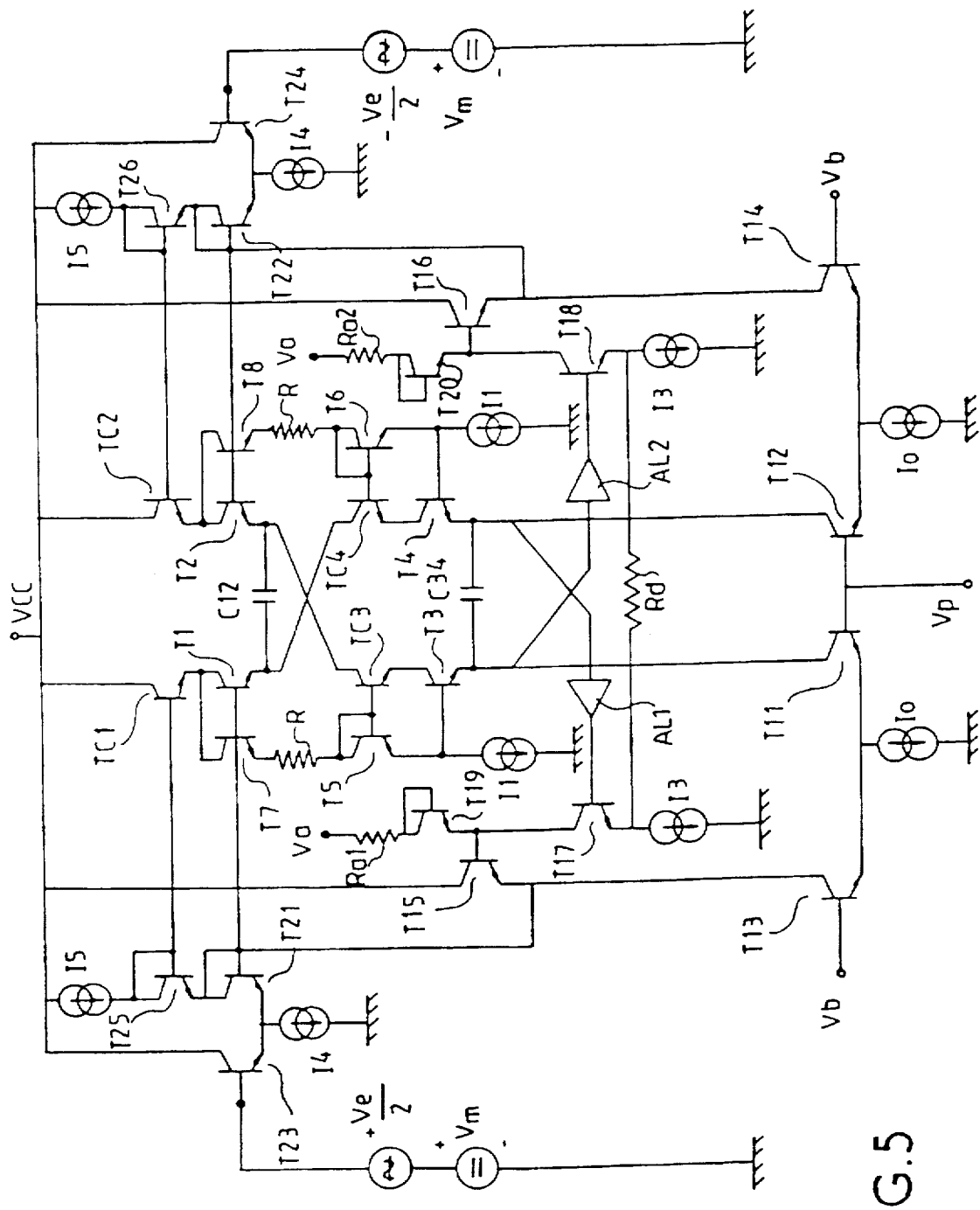
FIG. 5 represents the diagram of the sample-and-hold circuit in FIG. 3, in which a second improvement has been made.

FIG. 5 represents the diagram of the sample-and-hold circuit in FIG. 3, in which the second improvement has been made.

The diagram in FIG. 5 essentially repeats the elements from the diagram in FIG. 3.

It thus includes additional elements making it possible to reduce the parasitic coupling which exists, in the off state, between the input and output of the sample-and-hold circuit.

As is known to the person skilled in the art, this coupling is due to the parasitic base-emitter capacitances presented by the transistors T1 and T2 when they are off. According to the prior art, in order to overcome this drawback, the signal applied to the base B1 of the transistor T1 is then returned to the emitter E1 of the transistor T2 via a first capacitor of capacitance equal to the base-emitter capacitance of the transistor T2, and the signal applied to the base of the transistor T2 is returned to the emitter E1 of the transistor T1 via a second capacitor of capacitance equal to the base-emitter capacitance of the transistor T1. The variations in voltages present, in the off state, at the terminals of the capacitor C12 are thus cancelled by design. In the on state, the effect of these additional capacitors is negligible.

This solution is difficult to implement because of the small capacitances to be assigned to the capacitors of capacitance equal to the base-emitter capacitance of transistors T1 and T2 as discussed above. The capacitors used are then MOS capacitors which are difficult to match with the junction capacitances for which they are to compensate.

The invention does not have this drawback.

According to the invention, the sample-and-hold circuit comprises means making it possible for the residual dynamic voltage applied to the bases of T1 and T2, when the sample-and-hold circuit is off, to be attenuated with respect to the variations in the voltage Ve.

This is obtained by coupling the variable input voltages $$+\frac{Ve}{2} \text{ and } -\frac{Ve}{2}$$

to the respective transistors T1 and T2 via the respective switches T21 and T22 which are off when sample-and-hold circuit is off, and by lowering the dynamic impedance on the bases of T1 and T2. This change in regime is obtained by lowering the static potential applied to the bases of the transistors T1 and T2, when changing to off regime, by an equal quantity on each of the bases, regardless of the value of the voltage Ve stored. This results in the advantage of reducing the transient variation in the stored voltage when changing from the on state to the off state, and vice versa.

The circuits making it possible to decrease the potential on the bases of the transistors T1 and T2 act when changing from the on state to the off state. In order to allow better understanding of the operation of the sample-and-hold circuit, the diagram in FIG. 5 therefore includes the control circuits which make it possible to change from the on state to the off state. These control circuit are, of course, present regardless of the type of sample-and-hold circuit. Although they were not represented in the preceding figures, this is for reasons of simplification, since only the on state of the sample-and-hold circuit was then to be taken into account.

The control circuits consist of four transistors T11, T12, T13 and T14.

The emitter of the transistor T3 is connected to the collector of the transistor T11 whose emitter is connected, on the one hand, to a first current generator Io and, on the other hand, to the emitter of the transistor T13 whose collector is connected to the circuit making it possible to reduce the parasitic coupling and whose base is connected to a control voltage Vb.

For its part, the emitter of the transistor T4 is connected to the collector of the transistor T12 whose emitter is connected, on the one hand, to a second current generator Io and, on the other hand, to the emitter of the transistor T14 whose collector is connected to the circuit making it possible to reduce the parasitic coupling and whose base is connected to the same control voltage Vb. The bases of the transistors T11 and T12 are connected to the same control voltage Vp.

When the difference between the control voltages Vb–Vp is negative, for example of the order of –300 mV, the transistors T11 and T12 are on and the transistors T13 and T14 are off. Conversely, when the difference between the control voltages Vb—Vp is positive, for example greater than or equal to 300 mV, the transistors T13 and T14 are on, the sampler is off and the circuits making it possible to reduce the parasitic couplings are activated. The transistors T11 and T12 are off.

According to the circuit in FIG. 5, the variable input voltage $$+\frac{Ve}{2} \text{ and } -\frac{Ve}{2},$$

as well as the common-mode bias voltages Vm, are not directly applied to the bases B1 and B2.

The access circuit for the variable input voltage $$+\frac{Ve}{2}$$

therefore consists of an axis transistor T23, two transistors T21 and T25 connected in diode mode and two current generators I4 and I5.

The transistor T23 has its base connected to the variable input voltage $$+\frac{Ve}{2},$$

its collector connected to the supply voltage +Vcc and its emitter connected to the current generator I4.

The transistor T21 has its base connected to the base of the transistor T1, its emitter connected to the current generator I4 and its collector connected to the emitter of the transistor T25 whose base is connected to the base of the transistor TC1 and whose collector is connected to one terminal of the current generator I5, the other terminal of which is connected to the supply voltage +Vcc.

As mentioned above, the transistors T21 and T25 are connected in diode mode. The base and the collector of the transistor T21, on the other hand, as well as the base and the collector of the transistor T25, on the other hand, are therefore connected together.

The current I5 is used for forward-biasing the diode T21. Preferably, the value of the current I5 is equal to half that of the current I4. For its part, the transistor T25 is used for indexing to the "cascode" type transistor TC1 the voltage variations appearing on the transistor T1.

A circuit of the same type as just described for the access circuit for the variable input voltage $$+\frac{Ve}{2}$$

exists for the access of the variable input voltage $$-\frac{Ve}{2}.$$

This circuit has the same configuration as the circuit described above and comprises, in addition to two current generators I4 and I5, the transistors T24, T22 and T26 which correspond to the respective transistors T23, T21 and T25 above.

As mentioned above, the circuits making it possible to reduce the parasitic couplings are activated when the sample-and-hold circuit is off.

When the circuit is off, the transistors T13 and T14 are on. The transistor T13 has its collector connected to the emitter of a transistor T15 whose collector is connected to the supply voltage +Vcc, and the transistor T14 has its collector connected to the emitter of a transistor T16 whose collector is also connected to the supply voltage +Vcc. When the transistors T13 and T14 are on, the transistor T15 and T16 are therefore also on, leading to a reduction in the potential present on their emitters. Since the transistors T15 and T16 have their emitters respectively connected to the bases of the transistors T1 and T2, this results in the voltages applied to the bases of the transistors T1 and T2 also being reduced. The voltage reduction occurring on the bases of the transistors T1 and T2 then leads to the diodes T21 and T22 being reverse-biased, and jointly to the reduction in the impedances on the bases of T1 and T2 by turning the transistors T15 and T16 on.

According to the invention, the voltages applied to the bases of the transistors T15 and T16 are chosen to be sufficiently small to guarantee reverse-biasing of the diodes T21 and T22, even for the minimum variable input signals in the operating range.

The circuit making it possible to apply the base voltage of the transistor T15 comprises a resistor Ra1, a transistor T19 connected in diode mode, a transistor T17, a current generator I3 and a read amplifier AL1.

Similarly, the circuit making it possible to apply the base voltage of the transistor T16 comprises a resistor Ra2, preferably chosen with resistance equal to that of the resistor Ra1, a transistor T20 connected in diode mode, a transistor T18, a current generator I3 and a read amplifier AL2.

The transistors T17 and T18 constitute a differential amplifier of gain one, rendered degenerate by a resistor Rd connecting their emitters, the resistance of which is preferably twice the resistance of the resistor Ra1.

The base of the transistor T15 is connected, on the one hand, to the emitter of the transistor T19 and, on the other hand, to the collector of the transistor T17. The transistor T19 has its base connected to its collector, which is connected to a first terminal of the resistor Ra1, a second terminal of which is connected to the voltage Va.

The transistor T17 has its emitter connected to the current generator I3 and its base connected to the output of the read amplifier AL1 whose input is connected to the emitter of the transistor T4. The read amplifier AL1 is a buffer amplifier of very high input impedance and of gain one.

The circuit making it possible to apply the base voltage of the transistor T16 consists of components of the same type as the circuit making it possible to apply the base voltage of the transistor T15. As represented by FIG. 5, the architecture of the two circuits is identical: the transistor T18 fulfils the role of the transistor T17, the transistor T20 that of the transistor T19, and the read amplifier AL2 that of the read amplifier AL1.

According to the invention, the voltage difference applied to the bases of the transistors T15 and T16 is therefore indexed to the voltage stored across the terminals of the capacitor C34. This gives:

$$VC34=VE3-VE4=VB15-VB16$$

The result of this is that the variations affecting the base potential of the transistors T1 and T2 when changing from the on state to the off state are substantially equal. The variations in the output voltage of the sample-and-hold circuit during the transient from the on state to the off state are then advantageously minimized.

As mentioned above, the voltages applied to the bases of the transistors T15 and T16 are chosen to be sufficiently small to guarantee reverse-biasing of the diodes T21 and T22, even for the minimum variable signals in the operating range. The common-mode potential Va is then selected accordingly.

As shown in FIG. 5, the current generators I5 are of the positive type. The potential present on their output, that is to say where their load is connected, is less than their reference potential +Vcc. They are therefore made either using a PNP transistor, as is known to the person skilled in the art, or using a circuit such as the one represented in FIG. 6.

Figure 6:
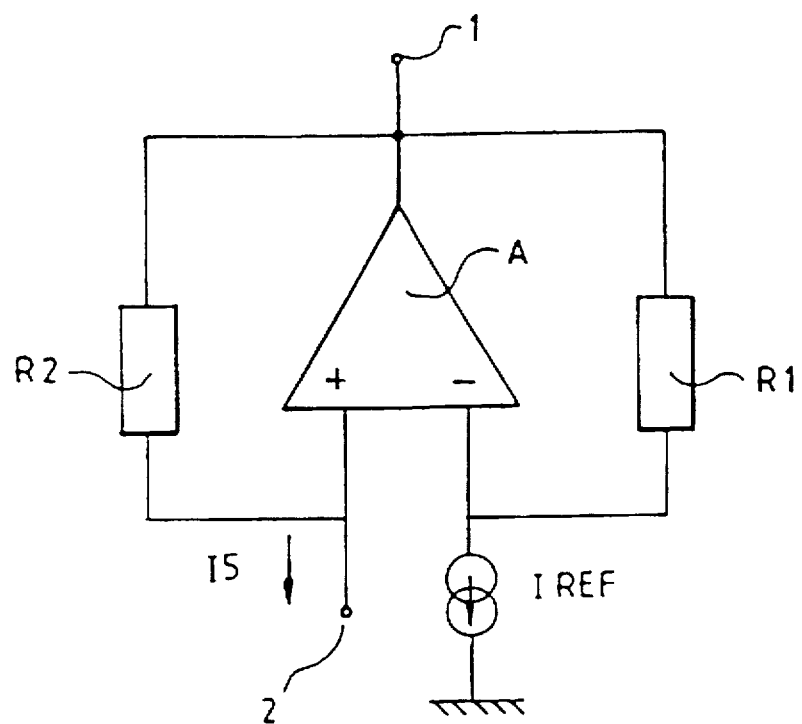
FIG. 6 represents a detail view of the circuit represented in FIG. 5.

The diagram in FIG. 6 represents an alternative to the current generator I5 with PNP transistors.

It comprises two resistors R1 and R2, one current generator Iref and one differential amplifier A whose design is based on NPN transistors.

The resistor R2 connects the uninverted input 2 of the amplifier A to the output 1 of the amplifier, and the resistor R1 connects the inverted input of the amplifier A of the output 1. The current generator Iref is placed between the inverted input and earth. This gives:

$$I5=Iref \times R1/R2.$$

The circuit in FIG. 6 represents the current generator I5. The output 1 of the amplifier A is that terminal of the current generator I5 connected to the supply voltage +Vcc, and the uninverted input of the amplifier A is that terminal of the current generator I5 connected to the collector of the transistor T25.

Advantageously, the amplifier A is an amplifier made using all-NPN fast technology, as described in the French Patent Application filed on 21 Nov., 1991 in the name of the company Thomson Composants Militaires et Spatiaux under national registration No. 91 14406.

FIGS. 4 and 5 separately represent two improvements made to the sample-and-hold circuit according to the invention. It is clear that the invention also relates to a circuit containing both of these improvements at the same time.

I claim:

1. A Differential sample-and-hold circuit comprising:

first and second transistors;

a switching controller switching said first and second transistors on and off;

an output capacitor providing an output signal of the differential sample-and-hold circuit, said output capacitor being connected to emitters of said first and second transistors; and current compensation circuitry making a current flowing through the first and second transistors constant when they have been switched on by the switching controller in spite of current variations arising in the output capacitor due to low levels of variation in a variable input signal being applied to bases of the first and second transistors, said current compensation circuitry including a current compensation capacitor connected to the first and second transistors so as to have current variations which are equal in amplitude but opposite in phase to current variations arising in the output capacitor.

2. A differential sample-and-hold circuit, comprising:

first and second transistors;

a switching controller switching said first and second transistors on and off;

an output capacitor connected between emitters of said first and second transistors and providing a differential sample-and-hold output; and current compensation circuitry maintaining current flowing through the first and second transistors constant when they are switched on by the switching controller, said current compensation circuitry including a first dynamic current generator, a second dynamic current generator, and a current compensating capacitor, the first dynamic current generator and the second dynamic current generator being modulated by a differential current which is output by said current compensating capacitor which has current variations equal in amplitude but opposite in phase to current variations appearing in the output capacitor.

3. The differential sample-and-hold circuit according to claim 2, wherein the first dynamic current generator comprises, a third transistor having a collector connected to the emitter of the second transistor via a fourth cascode transistor having an emitter connected to a first constant-current generator, said first dynamic current generator being modulated by a first modulation circuit comprising, a fifth transistor connected in diode mode with a base of the fifth transistor being connected to a collector of the fifth transistor as well as to a base of said fourth cascode transistor, the fifth transistor emitter being connected to the base of said third transistor and to a second constant current generator, a collector of said fifth transistor being connected to the first transistor via a first coupler so that the current flowing through said third transistor is modulated at a frequency of an input signal applied to the base of the first transistor; and wherein the second dynamic current generator comprises, a sixth transistor having a collector connected to the emitter of the first transistor via a seventh cascode transistor having an emitter connected to a third constant-current generator, said second dynamic current generator being modulated by a second modulation circuit comprising, an eighth transistor connected in diode mode with a base of the eighth transistor connected to a collector of the eighth transistor as well as to a base of the seventh cascode transistor the eighth transistor having an emitter connected to a base of said sixth transistor and to a fourth constant-current generator, the collector of said eighth transistor being connected to the second transistor via a second coupler so that the current flowing through said sixth transistor is modulated at an input frequency of a signal applied to the base of the second transistor.

4. The differential sample-and-hold circuit according to claim 3, wherein said first coupler comprises, a first dipole connecting the collector of said fifth transistor to the base of the first transistors; and wherein the said second coupler comprises, a second dipole, identical to the first dipole, said second dipole connecting the collector of said eighth transistor to the base of the second transistor.

5. The differential sample-and-hold circuit according to claim 4, wherein the first and second dipoles each comprise a set of diodes connected in series.

6. The differential sample-and-hold circuit according to claim 4, characterized in that the dipoles are made using a set of diodes connected in series.

7. The differential sample-and-hold circuit according to claim 4, further comprising:

an off mode compensation circuit reducing an amplitude of a dynamic signal applied to the bases of the first and second transistors by lowering a static potential at the bases of the first and second transistors by a same amount, regardless of said amplitude.

8. The differential sample-and-hold circuit according to claim 3, wherein said first coupler comprises, a first dipole connecting the collector of said fifth transistor to an emitter of a ninth transistor having a base and a collector respectively connected to the base and to the collector of the first transistor; and wherein said second coupler comprises, a second dipole connecting the collector of said eighth transistor to an emitter of a tenth transistor having a base and a collector respectively connected to the base and to the collector of the second transistor.

9. The differential sample-and-hold circuit according to claim 8, further comprising:

an off mode compensation circuit reducing an amplitude of a dynamic signal applied to the bases of the first and second transistors by lowering a static potential at the bases of the first and second transistors by a same amount, regardless of said amplitude.

10. The differential sample-and-hold circuit according to claim 8, wherein the first and second dipoles each comprise a resistor.

11. The differential sample-and-hold circuit according to claim 3, wherein said first coupler comprises, a first dipole connecting the collector of said fifth transistor to an emitter of a ninth transistor having a base connected to a base of a first additional transistor and a collector connected to a collector of the first transistor, an emitter of said first additional transistor being connected to a fifth constant-current generator and to the base of the first transistor; and wherein said second coupler comprises, a second dipole connecting the collector of said eighth transistor to an emitter of a tenth transistor having a base connected to a base of a second additional transistor and a collector connected to the collector of the second transistor, an emitter of said second additional transistor being connected to a sixth constant-current generator and the base of the second transistor.

12. The differential sample-and-hold circuit according to claim 11, further comprising:

an off mode compensation circuit reducing an amplitude of a dynamic signal applied to the bases of the first and second transistors by lowering a static potential at the bases of the first and second transistors by a same amount, regardless of said amplitude.

13. The differential sample-and-hold circuit according to claim 11, wherein the first and second dipoles each comprise a resistor.

14. The differential sample-and-hold circuit according to claim 3, further comprising:

an off mode compensation circuit reducing an amplitude of a dynamic signal applied to the bases of the first and second transistors by lowering a static potential at the bases of the first and second transistors by a same amount, regardless of said amplitude.

15. The differential sample-and-hold circuit according to claim 14, wherein the off mode compensation circuit comprises, an eleventh transistor which is on when the sample-and-hold circuit is off, an emitter of the eleventh transistor being connected to the base of the first transistor and a base of the eleventh transistor being connected to a first control circuit delivering a voltage indexed to the voltage collected from the emitter of said sixth transistor, and a twelfth transistor which is on when the sample-and-hold circuit is off, an emitter of the twelfth transistor being connected to the base of the second transistor and a base of the twelfth transistor being connected to a second control circuit delivering a voltage indexed to the voltage collected from the emitter of said third transistor.

16. The differential sample-and-hold circuit according to claim 15, wherein said first control circuit comprises, a first buffer amplifier having an input connected to the emitter of said sixth transistor and an output connected to a base of a thirteenth transistor having an emitter connected to a seventh constant-current generator and having a collector connected, on the one hand, to the base of said eleventh transistor which is on when the sample-and-hold circuit is off and, on the other hand, to an emitter of a fourteenth transistor connected in diode mode by having a base of the fourteenth transistor connected to a collector of the fourteenth transistor which fourteenth transistor collector is further connected via a first resistor to a DC voltage, and wherein said second control circuit comprises, a second buffer amplifier having an input connected to the emitter of said third transistor and an output connected to a base of a fifteenth transistor having an emitter connected to an eighth constant current generator and a collector connected, on the one hand, to the base of said twelfth transistor which is on when the sample-and-hold circuit is off and, on the other hand, to an emitter of a sixteenth transistor connected in diode mode by having a base of the sixteenth transistor connected to a collector of the sixteenth transistor which sixteenth transistor collector is further connected via a second resistor to said DC voltage with emitters of the thirteenth and fifteenth transistors being connected together via a third resistor.

17. The differential sample-and-hold circuit according to claim 16, wherein the base of the first transistor is connected to a base of a seventeenth transistor connected in diode mode, and wherein the base of the second transistor is connected to a base of an eighteenth transistor connected in diode mode.

18. The differential sample-and-hold circuit according to claim 14, wherein the first and second dipoles each comprise a resistor.

19. The differential sample-and-hold circuit according to claim 15, wherein the first and second dipoles each comprise a resistor.

20. The differential sample-and-hold circuit according to claim 16, wherein the first and second dipoles each comprise a resistor.

* * * * *